United States Patent [19]

Koppensteiner et al.

[11] Patent Number: 4,544,066

[45] Date of Patent: Oct. 1, 1985

[54] PRINTED WIRING BOARD FILE EMPLOYING WIRE STRUCTURAL MEMBERS

[75] Inventors: James V. Koppensteiner, Chicago; John E. Kaczkos, Elk Grove Village, both of Ill.

[73] Assignee: GTE Communication Systems Corporation, Northlake, Ill.

[21] Appl. No.: 611,237

[22] Filed: May 17, 1984

[51] Int. Cl.⁴ .............................................. H05K 1/14
[52] U.S. Cl. ...................................... 211/41; 361/415
[58] Field of Search .................. 211/41; 361/415, 390, 361/394, 399

[56] References Cited

U.S. PATENT DOCUMENTS

| | | | |
|---|---|---|---|
| 3,696,936 | 10/1972 | Straccia et al. | 361/415 X |
| 3,699,393 | 10/1972 | Reimer | 361/415 |
| 3,863,113 | 1/1975 | Ward | 361/415 |
| 4,022,326 | 5/1977 | Marconi | 211/41 |
| 4,327,835 | 5/1982 | Leger | 361/415 X |
| 4,429,937 | 2/1984 | Stockmaster | 361/415 X |
| 4,434,899 | 3/1984 | Rivkin | 361/415 X |

FOREIGN PATENT DOCUMENTS 2025145  1/1980  United Kingdom ............... 361/415

Primary Examiner—R. R. Kucia
Assistant Examiner—Tarick Basma
Attorney, Agent, or Firm—Robert J. Black; Gregory G. Hendricks

[57] ABSTRACT

A printed wiring board file employing guide tracks of wire construction to engage guide runners of printed wiring board assemblies to be mounted therein. The guide tracks are assembled to lateral positioning members at regular or optionally, predetermined differing spacings and each guide includes a forwardly projecting divergent lead-in area to assist in aligning the board assembly guide runner with the file guide tracks. A pair of depressions are formed in each guide track to engage corresponding projections in the guide runners to retain the board assemblies in their fully inserted position within the file.

9 Claims, 3 Drawing Figures

PRINTED WIRING BOARD FILE EMPLOYING WIRE STRUCTURAL MEMBERS

CROSS-REFERENCES TO RELATED APPLICATIONS

Related, commonly assigned, co-pending application entitled "Printed Wiring Board Assembly Employing Track Engaging Runners," Ser. No. 611,236 is filed concurrently herewith.

BACKGROUND OF THE INVENTION

The present invention relates to printed wiring board files, and more particularly to printed wiring board files of wire construction adapted to receive runners attached to printed wiring boards, the runners sliding on tracks affixed to the card file to position the printed wiring boards within the file.

Printed wiring board files mounting printed wiring boards and sometimes known as card files are well known to those skilled in the art. One type employs a metallic board file mounting printed wiring boards vertically. The file includes an upper surface, lower surface, two side surfaces, and a plurality of connectors mounted vertically across the back of the file. Upper guides and lower guides are formed in the upper and lower surfaces, respectively. Each upper guide is formed by making two U-shaped cuts in the upper surface. Each cut has an elongated base and two short legs perpendicular to the base. The bases are parallel and opposite each other and the legs of each cut extend toward the legs of the other cut. Once cut, the portion of the surface internal to each U-shaped cut is then bent downward perpendicular to the upper surface along a line extending between the ends of each such cut to form a board guide of U-shaped cross-section. Guides are formed in the lower surface in a similar manner.

Another type of printed wiring board file is described in U.S. Pat. No. 3,716,760, issued Feb. 13, 1973, to Ansano Bertelloti, et al., and teaches a printed wiring board file including a front support formed of a rectangular tubular member having a slotted steel card guide on its top and bottom surfaces and a rear support formed of a circular tubular member having a slotted card guide at the top and bottom. The front card guide slots are so shaped as to align a wiring board horizontally with the rear card guide slots while the rear support member serves to vertically align the wiring board during insertion of the board into an associated connector. The tubular members are supported and positioned relative to the connector by a pair of end bracket stampings engaging the tubular members, which stampings are affixed to an upright support member mounting the connectors.

The above card file arrangements, while operating generally satisfactorily, require the costly cutting, stamping and forming of sheet metal for their manufacture. Additionally, the use of sheet metal upper and lower surfaces includes the added disadvantage of restricting cooling of the printed wiring boards.

The present invention overcomes these problems by providing a new and improved arrangement for mounting printed wiring boards.

SUMMARY OF THE INVENTION

A printed wiring board file for use with a printed wiring board assembly including longitudinally channeled upper and lower edges is provided including at least two upper guide tracks, at least two lower guide tracks, at least one upper lateral positioning member and at least one lower lateral positioning member. Both positioning members are of an elongated construction and each includes a first and a second end, the upper positioning member being attached to each of the upper guide tracks to position the guide tracks in spaced relation to each other, the lower positioning member attached to each of the lower guide tracks to position the lower guide tracks in spaced relation to each other with the upper guide tracks and the lower guide tracks spaced in relation to each other in a like manner. A first and a second side member are provided and connected to the upper and the lower positioning members at a corresponding end of each, the side members retaining the positioning members in fixed parallel relation to each other with corresponding ones of the upper guide tracks and the lower guide tracks positioned parallel to and above one another.

The printed wiring board file of the present invention includes two side panel embodiments, one of planar sheet metal construction to which an upper and a lower track array is attached, and a second embodiment of wire member construction partially formed integral with the upper and lower track arrays and to which a side frame is added to provide structural support. Brackets are optionally added to the fronts of the side panels to mount the printed wiring board file within a frame, and to the rears of the side panels to mount a backplane containing connectors.

A printed wiring board assembly is provided including at least one guide runner attached thereto and is adapted to be mounted in the above printed wiring board file. The guide runner includes an elongated body of rigid construction including at least a first and a second lengthwise extending surface with both surfaces parallel to each other, a pair of elongated walls are provided extending from the body for the length of the body and perpendicular to the first surface, the walls are spaced apart a predetermined distance forming there between a printed wiring board receiving channel. The guide runner also includes a groove formed in the body second surface extending the length of the body and an arrangement for retaining the guide runner body to the printed wiring board. The groove is adapted to engage a respective guide track of the printed wiring board file.

BRIEF DESCRIPTION OF THE DRAWING

The various features and advantages of the printed wiring board file and printed wiring board assembly of the present invention will be apparent from the following description taken in conjunction with the accompanying drawing in which.

DESCRIPTION OF THE PREFERRED EMBODIMENT

Figure 1:
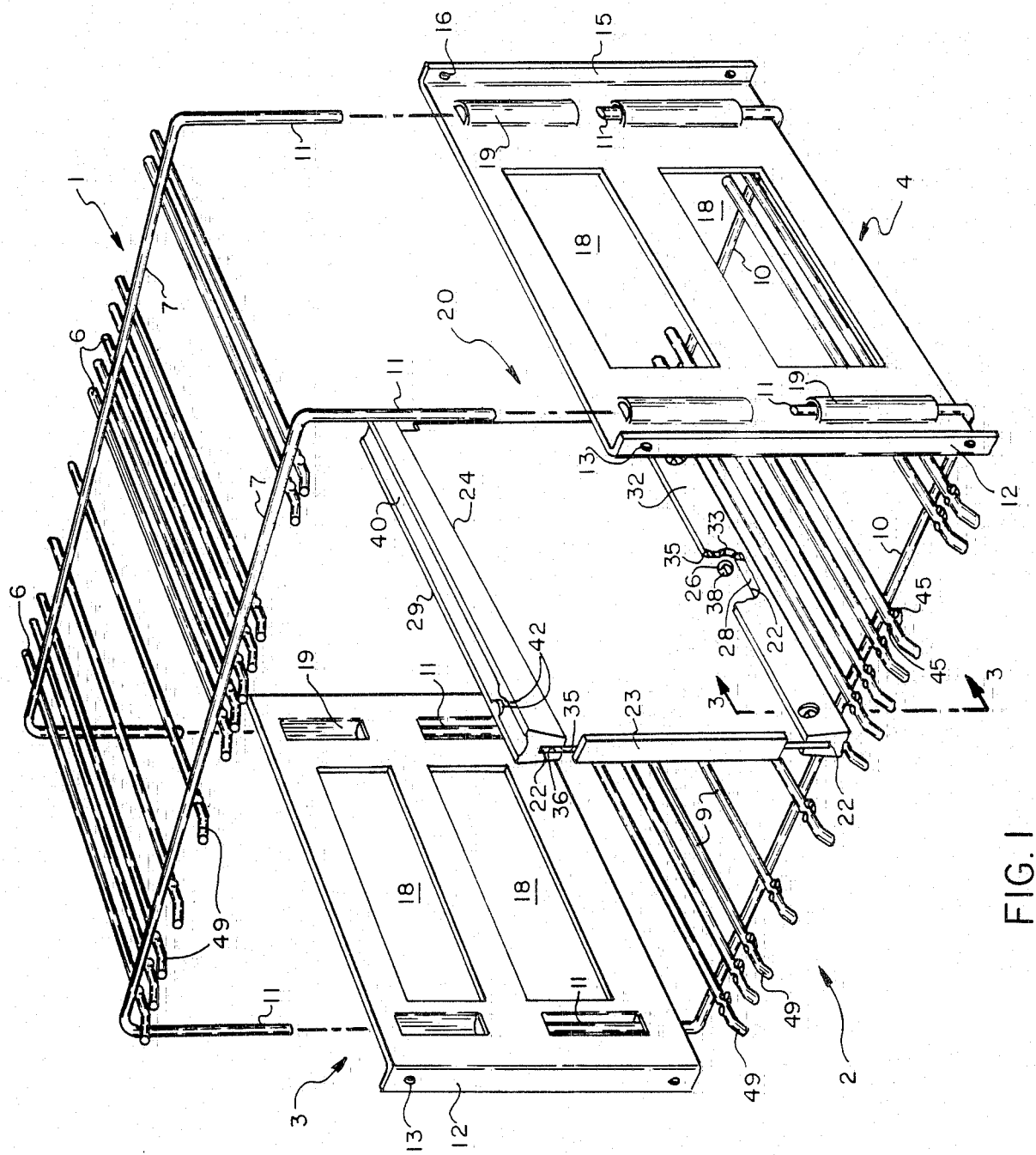
FIG. 1 is a partially exploded perspective view of a first embodiment of a printed wiring board file of the present invention adapted to receive and position a printed wiring board assembly including longitudinally channeled upper and lower edges.

Referring first to FIG. 1, there is shown a first embodiment of the printed wiring board file of the present invention including an upper printed wiring board track array 1, a lower printed wiring board track array 2, a left side panel 3 and a right side panel 4.

The upper track array 1 includes a plurality of upper printed wiring board guide tracks 6 attached to upper lateral positioning members 7. The lower track array 2 includes a plurality of lower guide tracks 9 attached to lower lateral positioning members 10. As is apparent from the drawing, the guide tracks 6 and 9 are each formed of a single length of straight wire with a divergent lead-in area at one end thereof and a pair of printed wiring board retaining depressions formed in the straight portion of the guide track near the divergent lead-in area. The lateral positioning members 7 and 10 of the track arrays 1 and 2 each include a foot 11 extending perpendicularly from each their ends.

The upper guide tracks 6 and the lower guide tracks 9 as well as the upper lateral positioning members 7 and the lower lateral positioning members 10 may be advantageously formed from wire of a suitable cross-section for their intended purposes. In this regard, the guide tracks 6 and 9 as well as the positioning members 7 and 10 may be formed of steel wire of circular cross-section. Alternatively, steel wire of triangular, rectangular or other suitable cross-section may be used. The guide tracks 6 and 9 may be attached to the lateral positioning members 7 and 10, respectively, by any of the techniques generally known to those skilled in the art, as for example by welding or brazing techniques, and may be spaced apart at regular intervals or at differing intervals as may be required by printed wiring board assemblies to be mounted therein.

The side panels 3 and 4 each include a front flange 12 including mounting holes 13 and a rear flange 15 including mounting holes 16. Side members 3 and 4 additionally include openings 18 formed in their central portions and raised channels 19 adapted to receive corresponding ones of the feet 11 of the lateral positioning members 7 and 10.

A printed wiring board assembly 20 is provided in the present invention including a printed wiring board 21 having a pair of opposite side edges 22 and a plurality of apertures 26 adjacent each of the edges 22. The board assembly 20 also includes a handle 23, an upper guide runner 24, and a lower guide runner 25.

Figure 3:
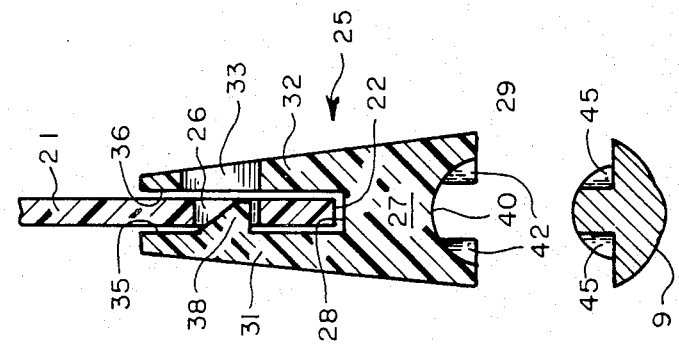
FIG. 3 is a cross-sectional view of the printed wiring board track and runner taken along line 3—3 in FIG. 1.

Referring now to FIG. 3, the upper guide runner 24 and the lower guide runner 25 are of similar construction and include a body 27 including an upper surface 28 and a lower surface 29. A left elongated wall 31 and a right elongated wall 32 extend from the body 27 in the direction of the body and perpendicular to the first surface 28. The elongated walls 31 and 32 each include respective inner surfaces 35 and 36. The surfaces are spaced apart sufficiently to permit passage of the printed wiring board 21 there between. A protrusion 38 is formed in the inner surface 35 of the first wall 31 extending in a direction toward the second wall 32. An aperture 33 is formed through the second wall 32 opposite the protrusion 38. A groove 40 is formed in the lower surface 29 of the guide runner body 27 and extends longitudinally the length of the body. A pair of protrusions 42 extend into the groove 40 from the body 27.

The guide tracks 6 and 9 each include a pair of depressions 45 formed in their surfaces, the depressions 45 adapted to engage the protrusions 42 of the guide runners 24 and 25.

The upper guide tracks 6 are assembled to the upper lateral positioning member 7 by any technique known to those skilled in the art, to form the upper track array 1. The lower track array 2 may similarly be formed by attaching the lower guide tracks 9 to the lower lateral positioning members 10 in a like manner. The depressions 45 may be formed in the guide tracks 6 and 9 either prior to or subsequent to assembling the guide tracks into the track arrays. The upper track array 1 and the lower track array 2 are then positioned opposite one another with their respective positioning member feet 11 facing one another. The left side member 3 and the right side member 4 is then positioned between the track arrays with corresponding ones of the channels 19 in alignment with corresponding ones of the feet 11. The track arrays are then forced towards each other to engage the positioning member feet within the channels 19 to form the printed wiring board file of the present invention.

Figure 2:
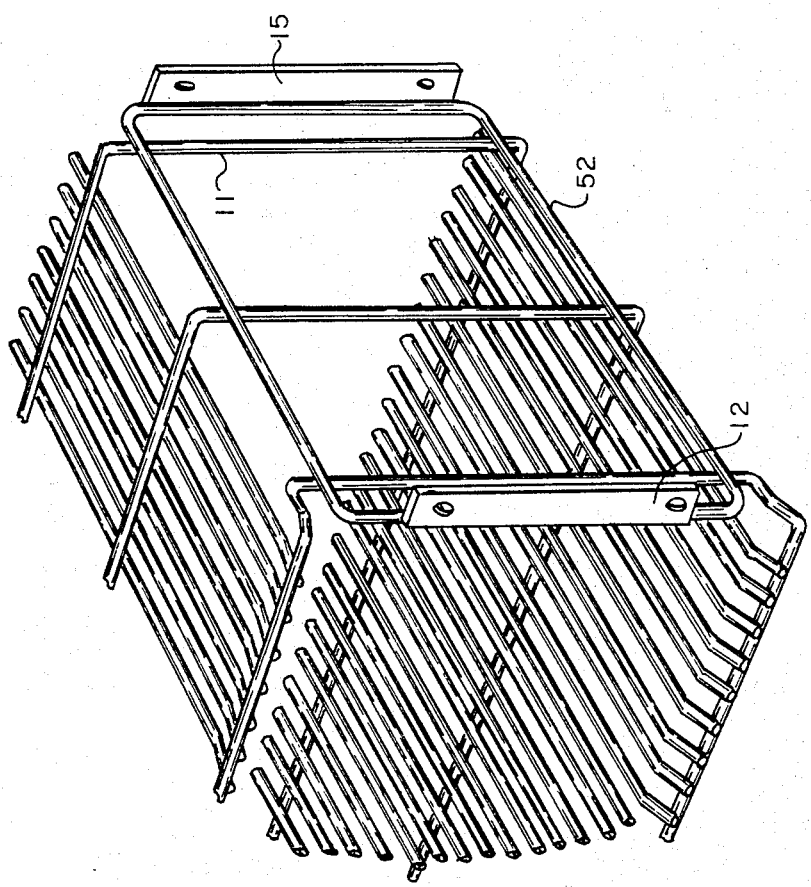
FIG. 2 is a partial perspective view of a printed wiring board file of the subject invention showing a second embodiment utilizing different file side members from those shown in FIG. 1.

Referring to FIG. 2, there is shown an alternate embodiment of the side member 4 of the present invention in which corresponding ones of the feet 11 of the lateral positioning members 7 and 10 are joined together by any well known technique (such as welding). Following their joining, pairs of the feet 11 on each side of the printed wiring board file of the present invention are attached to side frame 52 to provide structural support for the feet. A pair of the front flanges 12 and a pair of the rear flanges 15 may be attached to each of the side frames 52.

Regardless of the side member embodiment selected, apertures 13 in the front flanges 12 may be advantageously used to mount the printed wiring board file of the present invention to an equipment frame (not shown). Further, the apertures 16 of the rear flanges 15 may be advantageously used to mount a backplane (not shown) containing connectors and wiring serving to interconnect related printed wiring board assemblies within the printed wiring board file of the present invention.

Assembly of the guide runner to the printed wiring board will be described in relation to the lower printed wiring board guide runner 25 of the printed wiring board assembly 20. Referring now to FIG. 3, lower guide runner 25 is assembled to the printed wiring board 21 by orienting the guide runner 25 parallel to the printed wiring board 21 with the elongated walls 31 and 32 of the guide runner 25 parallel to and each on one side of the printed wiring board 21. Force is then applied to the lower guide runner 25 in a direction toward the printed wiring board 21 thereby causing the edge 21 to engage and deflect the projection 38 in a direction away from the wall 32 of the guide runner 25. The continued application of force to the guide runner 25 will then bring the edge 22 of the printed wiring board 21 into engagement with the first surface 28 of the guide runner 25 thus permitting the protrusion 38 extending from the side wall 35 of the first wall 31 to engage the aperture 26 in the printed wiring board 21 thus attaching the printed wiring board 21 to the guide runner 25. The upper guide runner 24 is attached to the printed wiring board 21 in a similar manner.

The guide runners 24 and 25 may be removed from engagement with the printed wiring board 21. In this regard and referring to FIG. 3, a rod of suitable size (not shown) may be inserted through the aperture 33 and force exerted thereon to urge the rod into the aperture 26, deflect the side wall 31 away from the printed wiring board 21 and remove the projection 38 from the aperture 26. Force may then be additionally applied to the guide runner body 27 in a direction away from the printed wiring board 21 to move the projection 38 out of alignment with the aperture 26 and to permit it to rest against a side of the printed wiring board 21. The rod may then be withdrawn and the procedure repeated for any remaining projections 38 of the guide runner 25. When all of the projections 38 have been repositioned out of their associated apertures 26, force may be applied to the guide runner 25 in a direction away from the printed wiring board 21 to completely disconnect the two elements from each other.

The printed wiring board runners 24 and 25 may be advantageously molded of a plastic material to provide a low coefficient of friction and rigidize the printed wiring board to thus minimize bowing and to thus protect thereon mounted components from stresses. The material may be provided in various colors to aid in identification and for aesthetic appeal. Additionally, the plastic may be of an electrically conductive type to eliminate static discharge problems.

The printed wiring board assembly 20 may be assembled to the printed wiring board file mounting position by aligning the channel 40 of the lower guide runner 25 with a corresponding lower guide track 9 of the printed wiring board file of the present invention. In a similar manner the upper guide runner 24 is aligned with the upper guide track 6. The guide tracks 6 and 9 each include a forwardly projecting divergent lead-in area 49 to assist in aligning the guide runners 24 and 25 with the guide tracks 6 and 9, respectively. Following alignment of the guide runners with the guide tracks force is exerted on the handle 23 of the printed wiring board assembly 20 in a direction toward the printed wiring board file of the present invention. The force applied to the handle 23 will slide the guide runners 24 and 25 along their respective guide tracks 6 and 7 to position the card within the card file. As the card assembly 20 approaches its home position the protrusions 42 extending into the channel 40 of the guide runners 24 and 25 will engage the guide tracks 6 and 7. The protrusions 42 will then be deflected outward and away from the guide tracks 6 and 7 to permit passage of the guide tracks. When the printed wiring board assembly 20 reaches its fully inserted position, the protrusions 42 will engage and snap into the depressions 45 of the guide tracks 6 and 9 thereby locking the printed wiring board within the printed wiring board file.

The printed wiring board assembly 20 may be removed from its fully inserted and locked position by applying force to the handle 23 in a direction away from the printed wiring board file. This action will disengage the protrusions 42 from the depressions 45 of the guide tracks 6 and 9, thus releasing the board assembly 20 and permitting it to be slidably removed from the printed wiring board file.

It will now be apparent that a printed wiring board file employing wiring guide tracks and a printed wiring board assembly equipped with guide runners, the guide runners including a longitudinally formed channel adapted to engage the guide tracks of the file have been described which offer advantages over prior art assemblies. The wire guide tracks 6 and 9, by virtue of their wire construction, may be assembled without the need of costly stamping and forming equipment required by the prior art assemblies and the printed wiring board runners may be formed using commonly known molding techniques.

Although the preferred embodiments of the invention have been illustrated, and those forms described in detail, it will be readily apparent to those skilled in the art that various modifications may be made therein without departing from the spirit of the invention or from the scope of the appended claims.

What is claimed is:

1. A printed wiring board file for use with at least a pair of printed wiring boards including longitudinally channeled upper and lower edges, and file comprising:
   at least two upper guide tracks, each track of single straight wire construction and arranged to be engaged with a corresponding one of said printed wiring board channel upper edges;
   at least two lower guide tracks, each track of single straight wire construction and arranged to be engaged with a corresponding one of said printed wiring board channel lower edges;
   at least one upper lateral positioning member and at least one lower lateral positioning member, both positioning members of elongated construction and each including a first and a second end, said upper guide tracks to position said tracks in spaced relation to each other, said lower positioning member attached to each of said lower guide tracks to position said tracks in spaced relation to each other, said upper guide tracks and said lower guide tracks spaced in relation to each other in a like manner; and
   a first and a second side member connected to said upper and said lower positioning members at a corresponding end thereof, said side members retaining said positioning members in fixed parallel relation to each other with a corresponding one of said upper guide tracks and a corresponding one of said lower guide tracks positioned parallel to and above one another, said upper and lower guide track pair defining a single card mounting position.

2. A printed wiring board file as claimed in claim 1, wherein: said side members are formed integral with said upper and said lower lateral positioning members.

3. A printed wiring board file as claimed in claim 2, wherein: said side members include a stabilizing frame of generally rectangular shape.

4. A printed wiring board file as claimed in claim 1, wherein: said side members each include a mounting flange adapted to mount said file to a frame.

5. A printed wiring board file as claimed in claim 1, wherein: said side members each include a mounting flange to mount a backplane to said file.

6. A printed wiring board file as claimed in claim 1, wherein: said tracks each include locking means to retain said associated printed wiring board in a fully inserted location there along.

7. A printed wiring board file as claimed in claim 6, wherein: said locking means includes at least one depression formed in said track.

8. A printed wiring board file as claimed in claim 1, wherein: said tracks are attached to said lateral positioning members spaced apart a like distance from an adjacent track.

9. A printed wiring board file as claimed in claim 1, wherein: said tracks are each attached to said lateral positioning members spaced apart a different predetermined distance from an adjacent track.

* * * * *